(12) United States Patent  
Chow

(10) Patent No.: US 6,646,903 B2  
(45) Date of Patent: Nov. 11, 2003

(54) FERROELECTRIC MEMORY INPUT/ OUTPUT APPARATUS

(75) Inventor: David GenLong Chow, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/005,676

(22) Filed: Dec. 3, 2001

(65) Prior Publication Data

US 2003/0103370 A1 Jun. 5, 2003

(51) Int. Cl.[7] ............................................. G11C 11/00
(52) U.S. Cl. ........................................ 365/145; 365/52
(58) Field of Search ............................. 365/145, 149, 365/51, 52, 63, 189.01, 189.04, 189.05, 230.03, 230.05, 230.06, 230.08, 233

(56) References Cited

U.S. PATENT DOCUMENTS

| | | | |
|---|---|---|---|
| 5,619,470 A | * | 4/1997 | Fukumoto .................... 365/145 |
| 5,745,403 A | * | 4/1998 | Taylor ......................... 365/145 |
| 5,802,583 A | * | 9/1998 | Yeager et al. ........... 365/189.05 |
| 5,963,464 A | * | 10/1999 | Dell et al. ...................... 365/52 |
| 6,026,008 A | * | 2/2000 | Feese ........................... 365/52 |
| 6,034,878 A | * | 3/2000 | Osaka et al. .................. 365/52 |
| 6,288,930 B1 | * | 9/2001 | Takeshima et al. .......... 365/145 |
| 6,320,782 B1 | * | 11/2001 | Takashima ................... 365/145 |
| 6,385,078 B2 | * | 5/2002 | Jeon ........................... 365/145 |
| 6,414,904 B2 | * | 7/2002 | So et al. ................. 365/189.04 |

* cited by examiner

Primary Examiner—Trong Phan
(74) Attorney, Agent, or Firm—Marger Johnson & McCollom

(57) ABSTRACT

A memory system. The system includes at least two ferroelectric memory devices arranged sequentially. Each memory device has a data in signal and a data out signal, and the data out signal each memory device is transmitted as the data in signal of the next device in sequence. A system controller generates an initial data in signal for the first memory device. A data bus transfers data between each memory device and the system controller and an address bus provide addressing of the memory devices.

13 Claims, 6 Drawing Sheets

FERROELECTRIC MEMORY INPUT/OUTPUT APPARATUS

BACKGROUND

1. Field

This disclosure relates to ferroelectric memory devices, more particularly methods to link multiple ferroelectric memory devices together for memory operations.

2. Background

Most commonly used memory devices have inorganic semiconductor materials such as silicon as the basis of their architectures. These memories are typically addressed in a matrix fashion, with the memory cells or locations laid out in an x-y grid. Each intersection point of the x-y grid is manufactured to contain a memory cell, making addressing of each cell more convenient and organized. This is true for many types of memories with which most users are familiar, including volatile and non-volatile memories.

However, one disadvantage of the silicon or other inorganic materials is that they require an individual electronic circuit for each memory cell. This raises the complexity of the manufacturing process, as the desire for higher density memory requires smaller components for that circuit. The raise in complexity has an accompanying raise in the cost of manufacturing the memories.

Organic materials provide a solution to this problem. Organic memory devices, sometimes also referred to as passive organic memory devices, generally have an organic layers such as polymers sandwiched between arrays of electrodes. Controlling the voltages between the two electrodes on either side of a particular location in the organic layer can temporarily alter the properties of the layer. The alteration of the properties can then be manipulated to store data. Generally, the organic material, the electrodes and their addressing lines will be referred to as a polymer ferroelectric memory array, or a ferroelectric memory array.

These polymer ferroelectric memory arrays are considered to be passive arrays. They do not have an individual electronic circuit for each location. They do not typically have transistors or capacitors as part of each memory cell as is commonly used in dynamic random access memory (DRAM). They are therefore simpler and easier to manufacture. However, currently these memory arrays have slower access times. Techniques may be developed that allow for faster access, making the polymer ferroelectric memory arrays a more competitive solution for main memory applications.

BRIEF DESCRIPTION OF THE DRAWINGS

The invention may be best understood by reading the disclosure with reference to the drawings, wherein.

DETAILED DESCRIPTION OF THE EMBODIMENTS

Ferroelectric memories may take many forms. One example of such a memory is a polymer ferroelectric memory. In this memory, a layer of organic polymer is sandwiched between two layers of electrodes. The organic polymer has ferroelectric properties that allow a change in the polarization state to indicate a '1' or a '0.' An example of such an array is shown in U.S. Pat. No. 6,055,180, issued Apr. 25, 2000.

Figure 1:
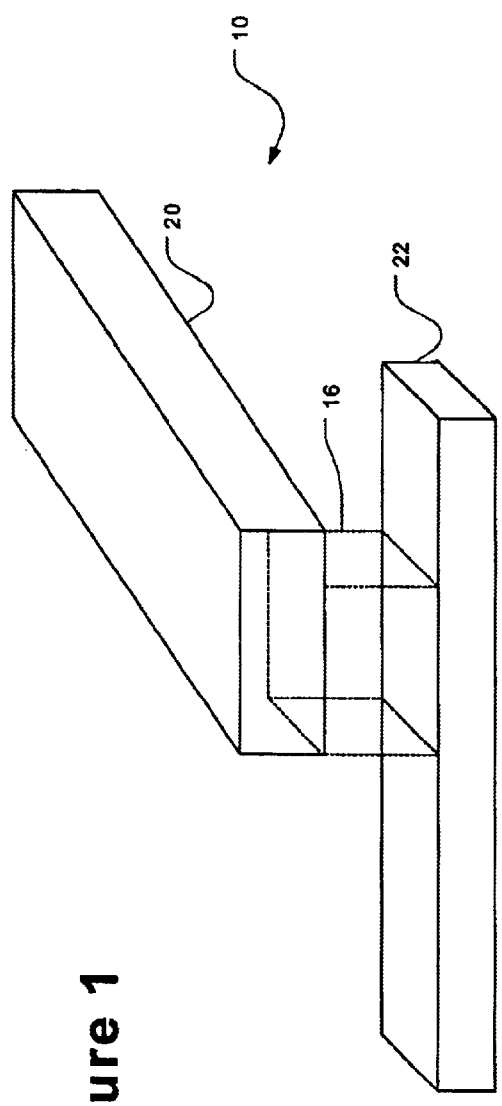
FIG. 1 shows one embodiment of a ferroelectric polymer memory device.

An example of a cell 10 of such an array is shown in FIG. 1. The organic material 16 is sandwiched between electrodes, such as 20 and 22. Electrode 20 may be further connected to other cells in the array as a word line and electrode 22 as a bit line. Data is stored in the array by application of an electric field through these electrodes. The organic material has properties such that polarization shifts remain after removal of the field. By manipulating the fields when applied, the polarization can be shifted, causing the remnant polarization to represent the state of the data bit.

These polymer ferroelectric memories do not typically require the individual electronic circuits of transistors for each cell, as are characteristic in other types of memory such as dynamic random access memories, (DRAM), or static random access memories (SRAM). This allows higher density arrays and increased manufacturability.

Figure 2:
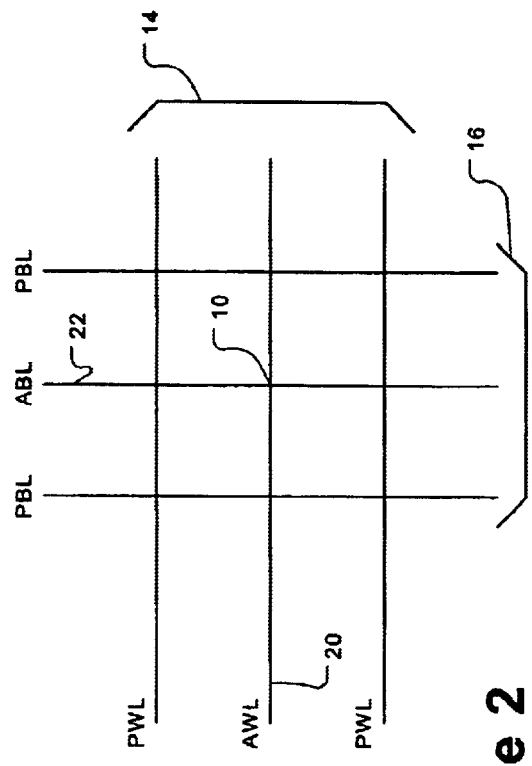
FIG. 2 shows one embodiment of a portion of a ferroelectric polymer memory array.

FIG. 2 shows a simplified portion of a memory array. As mentioned above, an organic polymer with ferroelectric properties separates the word line 20 from the bit line 22, forming the memory cell 10 at their crossing. A plurality of word lines 14 and bit lines 16 form the array, with a cell forming at every crossing.

Addressing a particular cell is performed by applying a voltage to the appropriate word line and bit line. For example, to address cell 10, word line 20 and bit line 22 would have a voltage applied to them. These will be referred to as the active word line (AWL) and the active bit line (ABL). The other bit lines and word lines will be referred to as passive lines, PBLs and PWLs, respectively. The passive lines have a bias voltage applied to them to assure quiescent level electric fields across the cells. This prevents erroneous reads and writes.

Arrays such as the one partially shown in FIG. 2 are arranged on individual memory devices with the appropriate input and output structures, such as multiplexers, row and column address decoders, sense amplifiers and storage elements, such as buffers and registers. These memory devices may link together sequentially, acting as a larger block of memory than is available on an individual device.

Figure 3:
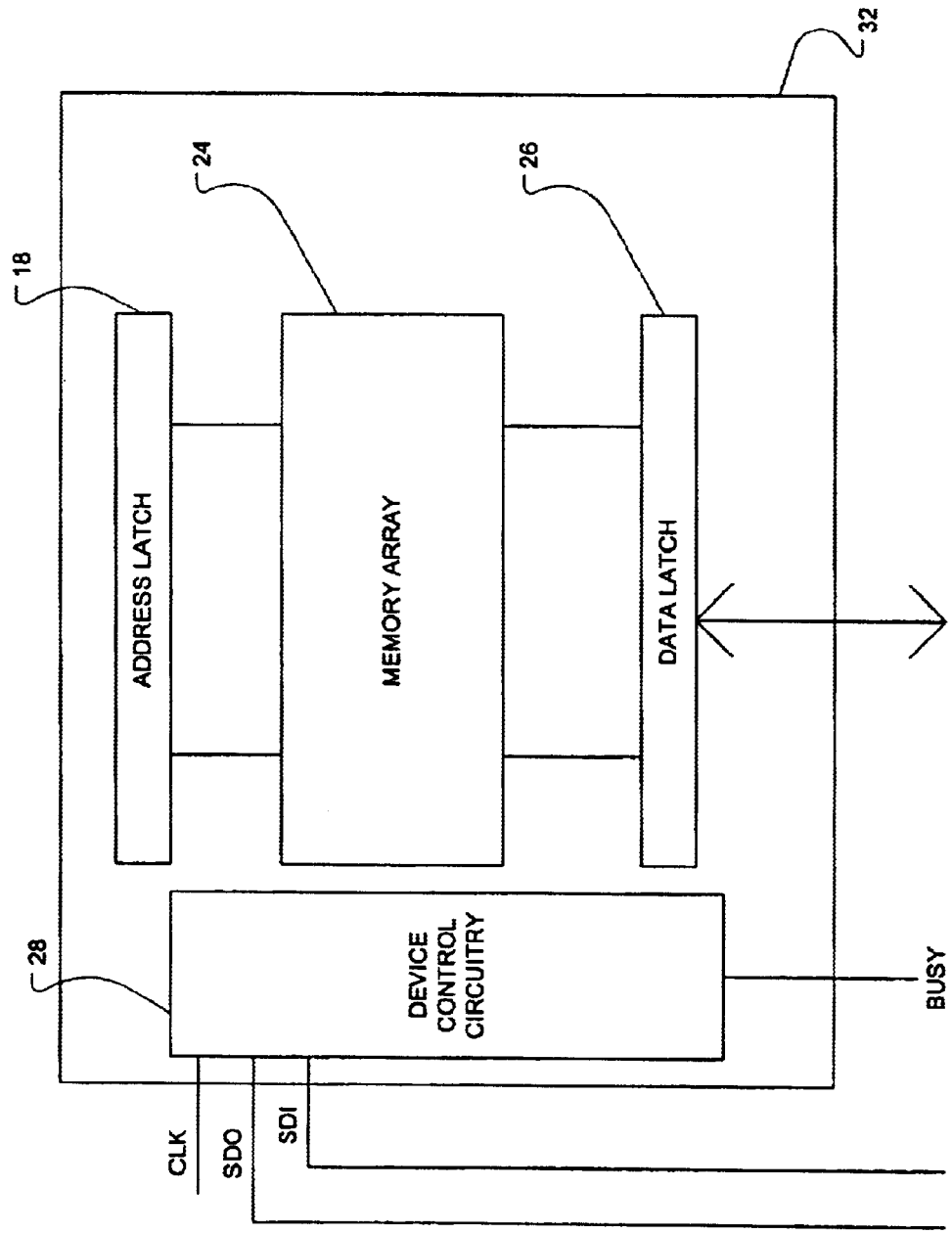
FIG. 3 shows an embodiment of a ferroelectric memory device, in accordance with the invention.

FIG. 3 shows one embodiment of a ferroelectric memory device, in accordance with the invention. The device 32 has a ferroelectric polymer array 24, operable to store the data. The memory array 32 is addressed through a combination of the device control circuitry 28 and the address latch 18. As will be discussed in more detail with regard to FIGS. 4 and 5, the address latch stores address information on the device, so the system may be also performing operations on other devices. Data latch 26 operates in a similar fashion.

The device control circuitry 28 may be one of several combinations of input and output multiplexers, row and column decoders, sense amplifiers, etc. In addition, this circuitry will receive and assert various control signals such as Serial Data In (SDI), Serial Data Out (SDO), a clock signal (CLK), and busy signal. The busy signal prevents the device from accepting any other control inputs during the assertion of that signal, usually when the memory array 24 is performing an internal read or write. These signals also give rise to other options in designing a memory system based upon the ferroelectric memories.

For example, the ferroelectric memories are typically slower than inorganic, semiconductor-based memories. It is therefore useful to have structures on the devices that allow several memories to be operating at once, at different points in their respective processes. Two of the structures that allow this to occur are the address latch and the data latch. These structures, as well as signal controls, allow several devices to be linked together to 'speed' up the average response time of the memories.

Figure 4:
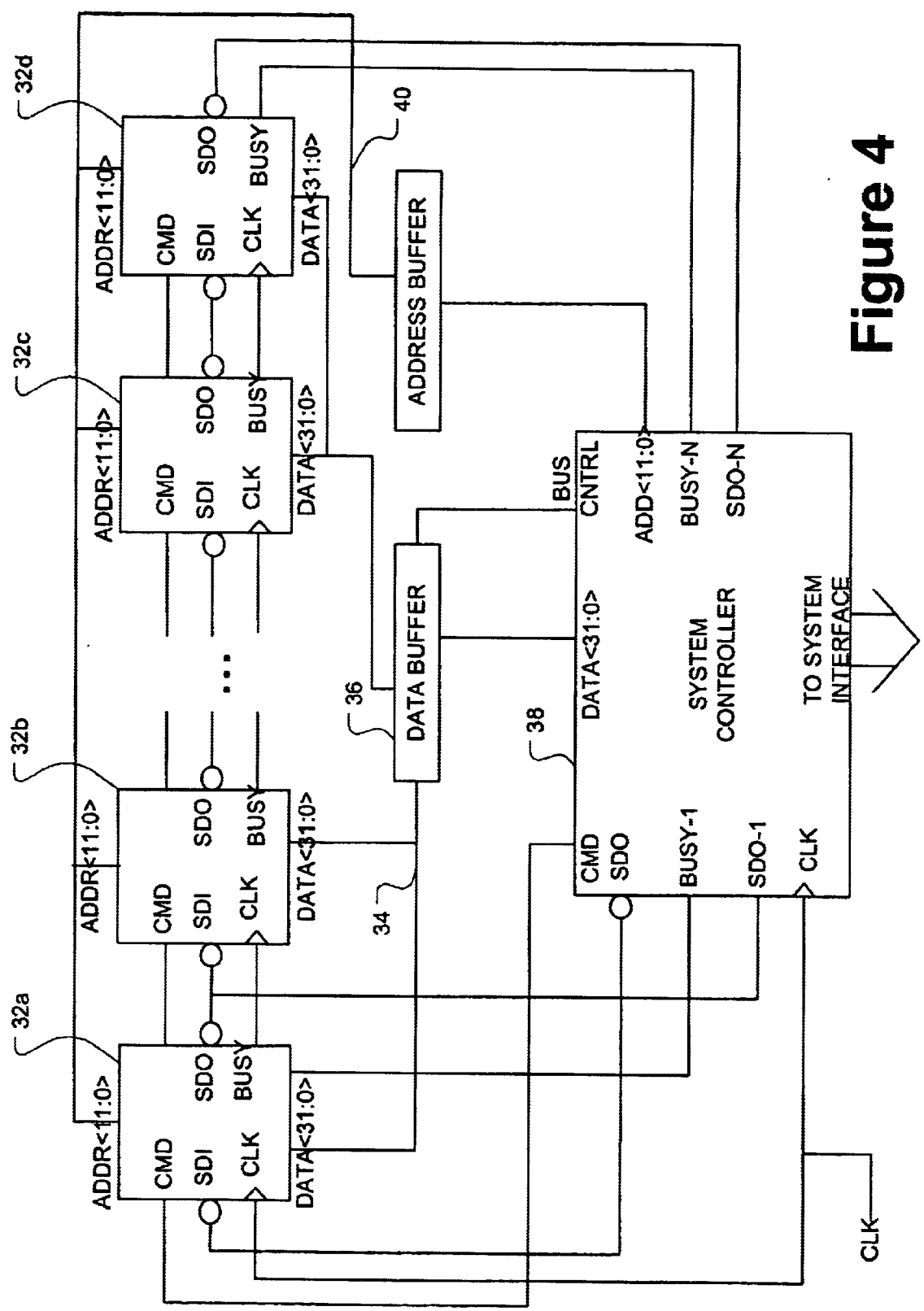
FIG. 4 shows one embodiment of multiple ferroelectric polymer memory devices linked sequentially, in accordance with the invention.

FIG. 4 shows one embodiment of a memory system having several ferroelectric memory devices linked together in a sequential manner. The memory system 30 will typically be a memory card, with several individual memory devices, or chips, mounted on the same printed circuit board. Examples of the individual memory chips are shown as 32a–32d. The actual number of individual chips within any given memory system is left up to the system designer.

Similarly, although the below example assumes certain dimensions of the individual memory chips as well as the memory system, these are merely for example and discussion purposes and are not intended to limit the scope of the invention in any way.

Specifically, the memory system 30 shown in FIG. 4 has several individual memory devices, each of which can move X number of bits of data onto or off of the data bus 34. In read operations, the data is stored in data buffer 36. As will be discussed in more detail later, each of these devices is assumed to be Y bits wide, and one row deep, for purposes of this example. This will cause each memory device in the sequential arrangement to process the data either on or off the chip in Z clock cycles (X×Z=Y).

Most memory operations in current practice act on memory sectors, where a sector is 512 bytes. Using the above dimensions of the example memory device, W number of these devices would be linked together to form one memory sector, 512×8 bits/byte equals 4096 bits, which in turn equals Y bits×W device. These memory devices can be arranged sequentially, under the control of one system controller, such as that shown at 38. The system controller generates the BUS CNTRL and command CMD signals to handle bus transactions and communications with a system in which the memory system resides through a SYSTEM INTERFACE.

In a read sequence, address and control signals are sent to all devices simultaneously. In some embodiments data lines may also be common to all of the devices to conserver routing on the printed circuit board (PCB). During the first part of the read sequence, as will be discussed in more detail later, the individual devices assert the BUSY signal. When the first device in the sequence deasserts the BUSY signal, the system controller 38 generates a serial data out signal SDO, used as the input of the first of the sequentially arranged memory devices. Any number memory devices may be used, defined as the variable W above. However, at least two memory devices must be present to perform the sequential linking discussed here. An extension of the signal names will be used in the following figures to indicate from which device a signal comes, such as serial data out signal for the first memory device would be referred to as SDO-1.

The data in signal, SDI, of the first memory array 32a, will cause the array to transfer data onto the data bus 34. The data transferred is that located at a given address, sent by the system controller to the address lines, ADD, of the memory chip 32a. When the transfer is completed for memory device 32a, the memory device generates a data out signal SDO that signals that the data transfer for that device is completed. By connecting the SDO signal of the first memory device to the SDI pin of the next memory array, the SDO signal can be used to signal the next memory device to transfer its data. This continues from one memory device to the other, until the last memory device in the sequential arrangement has completed its transfer. The last memory device, in this case memory device 32d, sends SDO to the system controller to indicate that the memory has completed the operation and is ready for another.

The names, abbreviations and brief descriptions of the signals are shown below.

| Signal Name | Abbreviation | Description |
| --- | --- | --- |
| External clock | CLK | System controller transitions occur on the falling edge of CLK. The memory chips sample the input pins on the rising edge of the clock. Output transitions from the memory devices are clocked by the rising edge of the clock. |
| Read/Write | RD/WR | Read is an active low signal. Write is an active high. |
| Address strobe | ADS | This is an active low signal. If low on the rising edge of a clock cycle, a read/write cycle is initiated. All control pins should be latched when ADS is active. |
| Address | ADDR | Multiplexed address lines. Upper address bits are transferred on ADS active and the rising edge of the clock. Lower address bits are transferred on the next rising edge of the clock. |
| Data | DATA<31:0> | Multiplexed data lines, driven by the memory devices on the rising edge of the clock, and the system controller on the falling edge of the clock. |
| Chip enable | ENB | Active low. If high, memory device is disabled. |
| Serial data in | SDI | Transition from high to low initiates a request for transfer of data onto DATA bus. |

-continued

| Signal Name | Abbreviation | Description |
| --- | --- | --- |
| Serial data out | SDO | Transitions to low for one clock cycle following completion of transfer. |
| Busy | BUSY | Active low signal indicated that the memory chip is busy with an internal read/write operation. |
| Ignore data | IGRD | Active low signal causing data read out of the memory chips to be ignored not transferred to the data bus. Used to clear the memory. |

Figure 5:
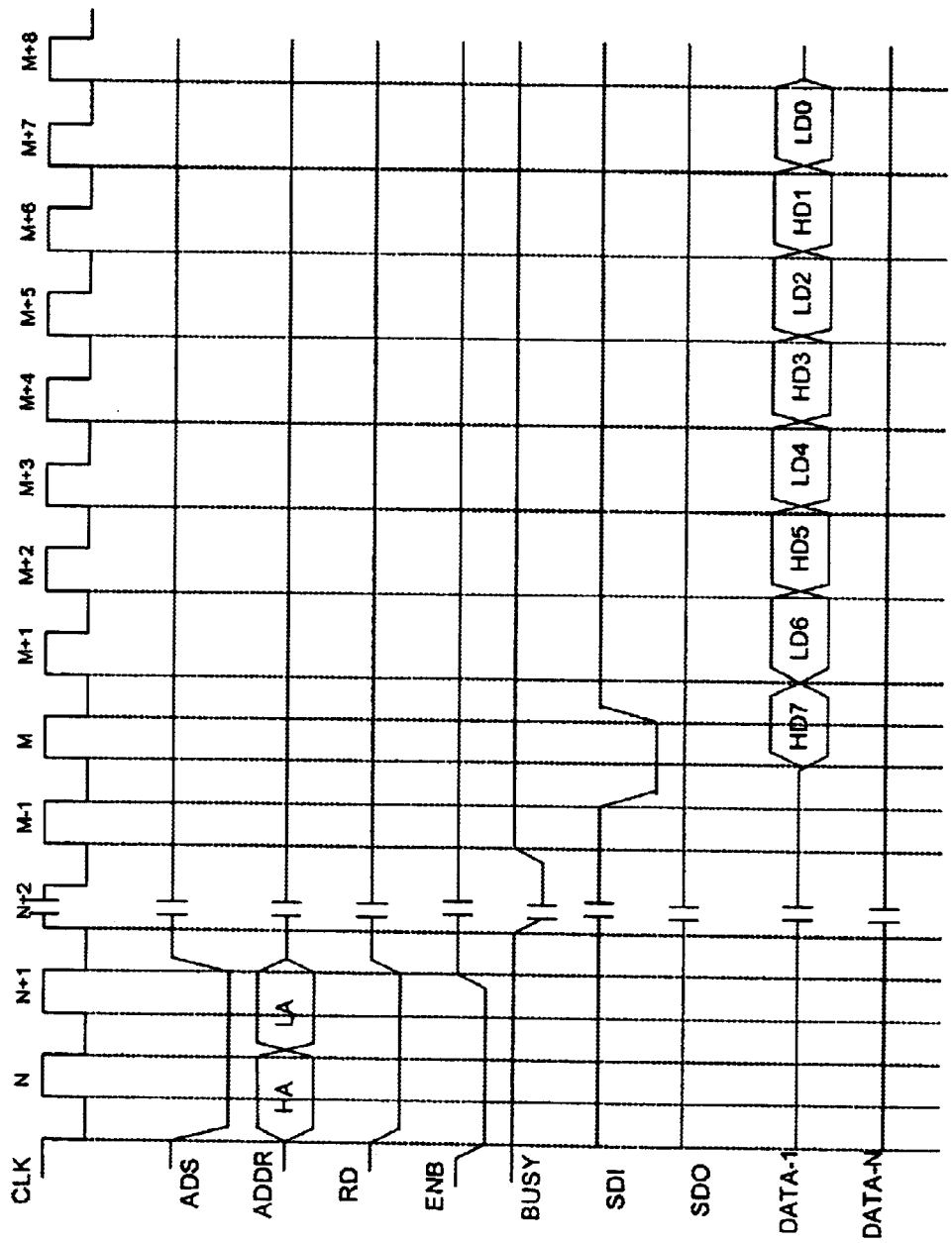
FIG. 5 shows one embodiment of a timing diagram for performing read operations on multiple ferroelectric polymer memory devices linked sequentially.

Using the above abbreviations, an example of a read cycle using sequentially linked memory devices can be discussed. A timing diagram for an example of such a cycle is shown in FIG. 5. All references to the diagram will be in terms of the clock periods shown at the top of the diagram, N through M+8.

A half cycle prior to the clock cycle, N, on the falling edge of the clock signal, CLK, the controller transitions related to read cycle occur. The controller asserts the high addresses, HA on the address bus 40 in FIG. 4. LA will refer to low addresses. The controller also asserts the RD and ENB signals, and IGRD signal, if desired. With RD asserted low, the system assumes that this is a read cycle. The controller also asserts the address strobe, ADS, at this time.

On the rising edge of CLK, at N, the memory chip samples the input pins and senses that ADS is active, indicating the beginning of a memory access cycle. When ADS is low, the RD, ENB and HA signals are latched, as is the IGRD if asserted. The impact of IGRD being asserted will be discussed in more detail with reference to FIG. 6.

On the next falling edge of the CLK, a half cycle after the memory chip samples its input pins and a full clock cycle after the high address was placed on the address bus, the controller places the low address on the address bus. At N+1, on the next rising edge, the memory device latches the low address information.

The system controller de-asserts ADS on the next falling edge, at N+1.5. The other control signals of RD, ENB and IGRD, if applicable, become indeterminate or 'don't cares.' This is shown as the middle position, between low and high for each signal in the timing diagram.

At N+2, the next rising edge of CLK, the memory device asserts the BUSY signal and initiates an internal read. All inputs are ignored until the read operation is completed. Sense amps operable to sense the state of the elements of the memory array are strobed after a programmed read delay. The data latch on the accessed device captures the data, once the read operation is completed. When the memory device completes its internal read, it de-asserts the BUSY signal. As shown in the timing diagram, the length of the asserted period for the BUSY signal is not fixed. The nature of the ferroelectric memory array may cause this time to fluctuate slightly. When the memory device is done with the internal read, the necessary signals are triggered at the deassertion of the BUSY signal on the next rising clock period after the internal read. This is shown on the diagram as clock period M−1.

During the period M−1 to M−0.5, the memory device assumes a wait state until the controller asserts the SDI signal on the memory device. The controller is actually requesting that the serial data be read out, but is used to initiate the SDI sequence for the memory chips. A half clock cycle later, at M, the memory chip recognizes the assertion of the SDI signal and drives high data <255:224> onto the data bus on the rising edge. In the timing diagram, the high data is referred to as HD7. In the subsequent memory cycles, M+1 through M+7, the memory chip drives the corresponding data onto the data bus. The data corresponds to the clock cycles as follows: M+1 is low data, LD6, <223:192>; M+2 is HD5 <191:160>; M+3 is LD4 <159:128>; M+4 is HD3 <127:96>; M+5 is LD2 <95:64>; M+6 is HD1 <63:32>; and M+7 is <31:0> is LD0. However, the order of the data out on the data bus is flexible.

At M+8, the memory chip releases the data bus and it assumes a floating state. In the same clock cycle, the memory chip asserts SDO and holds it for one clock cycle until M+9. The additional cycle allows the data bus to turnaround to prevent multiple devices from driving the data bus. When several memory devices are sequentially linked as shown in FIG. 4, they share the same data bus and the assertion of SDO by a memory device by any device but the last in the sequence has the added affect of asserting SDI in the next chip in the sequence.

As can be seen in the timing diagram, the data line for the next chip, DATA-N, begins with data transfers at M+9. Prior to this, the system controller will be tracking the data transfers occurring at the previous chip, or at least tracking the clock cycles and will do the necessary preparations shown in cycles N−0.5 to M−1 in the first device. In this manner, M+8 for the first device is the equivalent clock cycle as M for the next device in the sequence. This sequencing continues until the last device in the sequence completes its data reads and then asserts SDO, which is transmitted back to the system controller, as shown in FIG. 4. In this manner, the memory devices drive a continuous stream of data with one preparatory, or 'dummy,' clock cycle of no data driven onto the data bus between devices.

The unique nature of the ferroelectric memories gives rise to several characteristics of device-level input and output operations. For example, the reading of a memory array or device is destructive. That is, the reading of the data destroys the data stored in the array. This characteristic can be used to clear the memory devices without having the relatively longer cycle necessary for a typical read cycle.

As mentioned above, a signal IGRD allows each device to ignore the data being read out of the device. The data is ignored in that it is not placed on the data bus. When IGRD is asserted when ADS is asserted, the memory devices sense that and do not put the data on the bus. An example of a timing diagram for this process is shown in FIG. 6.

When the IGRD is asserted with ADS, at N−0.5 in the example above, the memory device will sense that on the rising edge of the clock period N. The data bus remains floating and the system controller does not assert SDI for the first memory chip. The memory chip asserts BUSY until the internal read operation is completed. The memory chip will not drive SDO. The system controller only looks at the deassertion of the busy signal to indicate the end of the cycle. Since the data is not being pushed out to the bus, all of the chips receive the IGRD signal in parallel and similarly read out the data in a parallel fashion. This allows all of the chips to be cleared substantially simultaneously. After BUSY is deasserted, the system controller can immediately initiate a new cycle, allowing faster data throughput.

Figure 7:
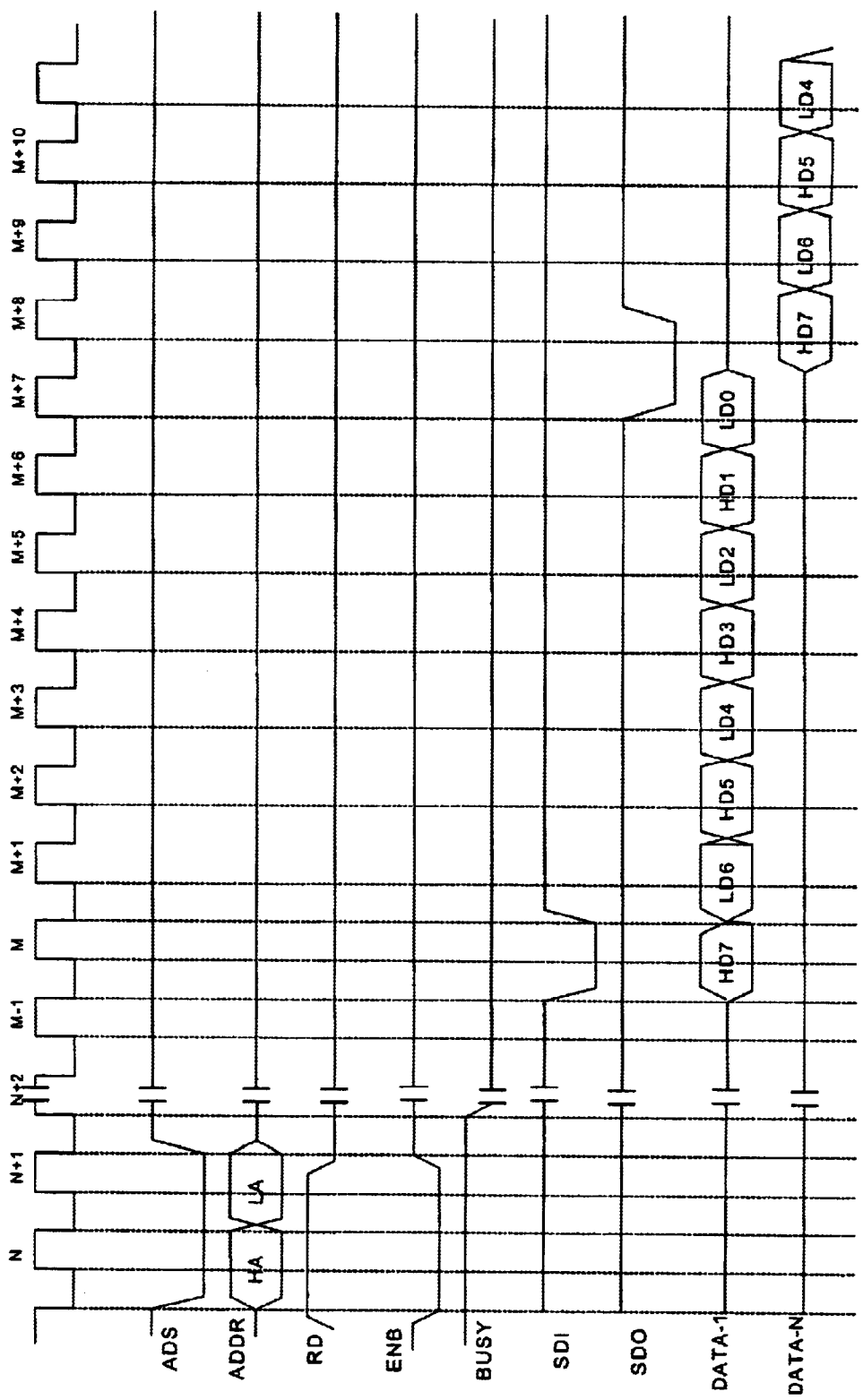
FIG. 7 shows one embodiment of a timing diagram for performing write operations on multiple ferroelectric polymer memory devices linked sequentially, in accordance with the invention.

Writing operations for the sequentially linked memory devices occurs in a similar fashion to the read operations. A timing diagram of one example of such an operation is shown in FIG. 7. Again, references to the various signals and time periods will be in terms of the CLK signal shown at the top of the diagram.

Figure 6:
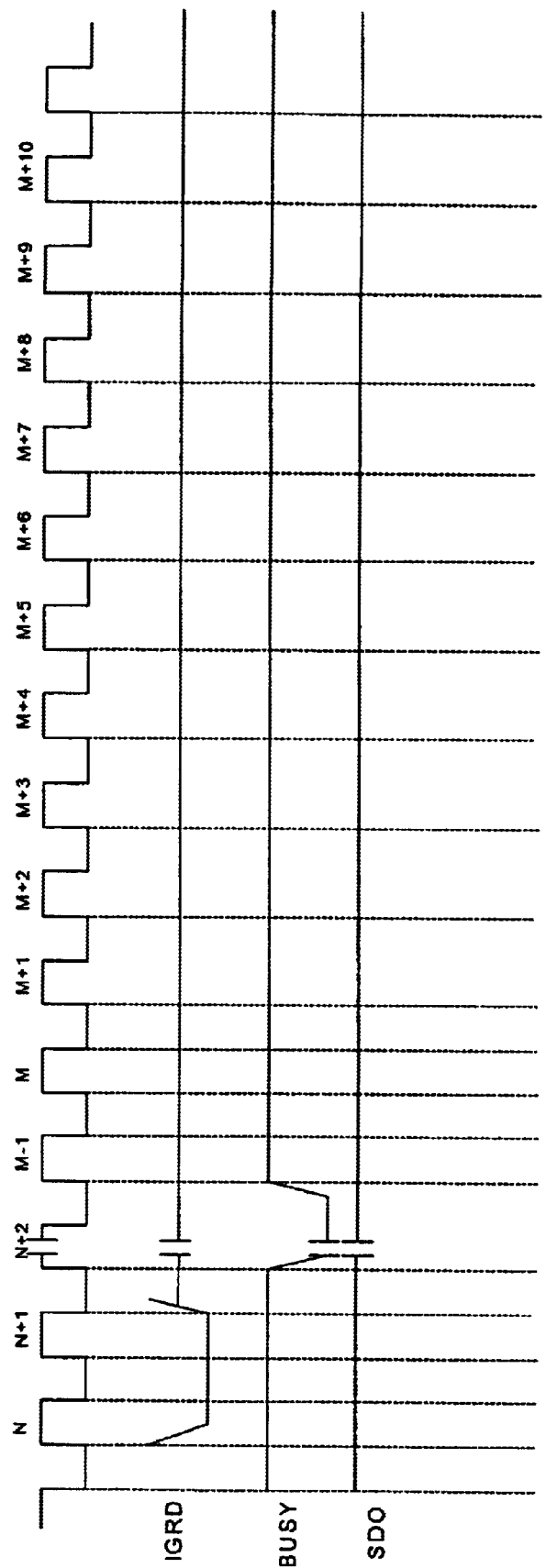
FIG. 6 shows one embodiment of a timing diagram for a read operation with data ignored, respectively, in accordance with the invention.

Similar to FIG. 6 and the read cycle, the controller signal transitions occur a half clock cycle before the N clock cycle. The controller drives the RD signal high, indicating that it is a write cycle, and asserts the ENB signal. Finally, the controller places the high address bits HA on the address bus. At the rising edge of the N clock cycle, the memory device senses ADS. In the next cycle, the device latches the RD, ENB and address signals. The address signals are latched using the address latch shown in FIG. 3.

A half cycle after the memory device latches those signals, the controller puts the low address bits LA onto the data bus. The memory device latches these on the rising edge of the next clock cycle, N+1. The system controller then de-asserts ADS on the next half clock cycle and the other signals, RD, ENB, and IGRD are don't cares. The memory device waits for the write data.

At N+2, the memory device initiates an internal write operation, asserting the BUSY signal, indicating that it is now ready for the write data. The system controller will inform the memory device that data is available on the data bus by asserting the SDI signal at M−0.5. Thee SDI signal can be asserted as early as the N+2 cycle. At M, the memory device senses the SDI signal assertion and latches the data from the data bus. As can be seen on the DATA line of the timing diagram in FIG. 7, the data becomes available every falling edge of CLK, to be latched by the memory device on the next rising edge. Data is sent to the devices in HD7, LD6 etc. order. Finally, at M+7, the first memory device in the sequence receives the last 32 bits of data from the bus, <31:0>, LD0.

At M+8, the memory device asserts SDO for 1 cycle. This initiates the data transfer for the next 256 bits into the next memory device, as shown on the DATA line in the timing diagram. This process continues until all of the devices have received their data. The system controller is continuously driving data on the data bus. While the second memory device is receiving its data, the first memory device performs its internal write operation. The first memory device will then de-assert the busy signal, while the remaining devices in the system are still cycling through their data reception processes. In this manner, the writing of sequentially linked ferroelectric memory devices can occur with minimum overhead.

These linked memory devices can be accessed successively for read-only or write-only memory operations, before the entire completion of the previous command. The system controller can issue a second read command while the previous read data transfer is still being executed further down the sequence, which is similar for successive writes. To perform successive writes, performing successive reads, the memory device receives the second read command, but cannot begin until there is no pending data to be driven out from the previous read. This improves the sensitivity of the sensing of the state of the polarization of the array cells. It avoids input/output buffer noise being injected into the sensing operations. However, a new address can be loaded before the current data is unloaded from that device, but must wait until BUSY is de-asserted. The memory device will receive the address and assume it is still in the READ mode. The new read operation will not begin until the SDI signal is asserted.

To perform successive writes, the new address and data can be loaded while the device is BUSY. The device will assume that it is still in the WRITE mode and initiate a new WRITE after the pending operation is completed.

In this manner, the cheaper and more manufacturable polymer ferroelectric memories can be used in a sequential fashion. This allows some gains in access speeds as well as allowing larger blocks of memory to be accessed. Although there has been described to this point a particular embodiment for a method and apparatus for sequentially linking ferroelectric memory devices, it is not intended that such specific references be considered as limitations upon the scope of this invention except in-so-far as set forth in the following claims.

What is claimed is:

1. A memory system, comprising:
   at least two ferroelectric memory devices arranged sequentially, wherein:
      each memory device has a data in control signal line, a data out control signal line, and a busy signal line;
      the data out control signal line of each memory device is electrically connected to the data in control signal line of a next device in sequence, terminating with a last device;
   a system controller to generate an initial data in control signal for a first memory device;
   a data bus to transfer data between each memory device and the system controller; and
   an address bus to provide addressing of the memory devices.

2. The memory system of claim 1, wherein each memory device further comprises an address latch and a data latch, operable to temporarily hold address and data signals.

3. The memory system of claim 1, wherein the at least two ferroelectric memory devices further comprises sixteen ferroelectric memory devices.

4. The memory system of claim 1, wherein the system controller is also operable to receive a data out control signal from the last device.

5. A method of performing a read operation on at least two ferroelectric memory devices linked sequentially, the method comprising:
   transmitting an address to the ferroelectric memory devices;
   detecting a busy signal from the ferroelectric memory devices;
   asserting a data in control signal for a selected one of the memory devices;
   receiving data from the selected one of the memory devices, until all data has been received from the selected one;
   asserting a data out control signal from the selected one, wherein a line upon which the data out control signal is asserted from the selected one is electrically connected to a line upon which a data in control signal is asserted for a next memory device;
   repeating the receiving and asserting processes until all data has been received from all devices.

6. The method of claim 5, wherein the method further comprises sending an address for a new read operation before all data has been received from all devices.

7. The method of claim 5, wherein the at least two ferroelectric memory devices further comprises sixteen ferroelectric memory devices.

8. A method of performing a write operation on at least two ferroelectric memory devices linked sequentially, the method comprising:

receiving a data in control signal from a system controller, indicating that data is available to be written to a selected one of the memory devices;

receiving data from the system controller at the selected one;

asserting a busy signal;

asserting a data out control signal, indicating that the selected one of the devices has completed the write operation for that device; and receiving data from the system controller at each of the memory devices until all memory arrays have received their data.

9. The method of claim 8, wherein receiving data from the system controller further comprises a continuous stream of data on the data bus.

10. The method of claim 8, wherein the at least two ferroelectric memory devices further comprise sixteen ferroelectric memory devices.

11. A memory device, comprising:

a ferroelectric polymer memory array;

an address latch, operable to temporarily store addresses for memory operations;

a data latch, operable to temporarily store data; and device control circuitry operable to:

receive and send control signals, external to the memory device, such that a serial data out signal is transmitted to an adjacent memory device as a serial data in signal, the control signals including a busy signal receivable from the ferroelectric polymer memory array;

direct the address latch to receive address signals; and direct the data latch to receive and send data signals.

12. The memory device of claim 11, wherein the device control circuitry further comprises row and column decoders for addresses in the ferroelectric memory array.

13. The memory device of claim 11, wherein the control signals include a serial data in control signal and a serial data out control signal.

* * * * *